(12) United States Patent
Mondot

(10) Patent No.: US 10,495,676 B2
(45) Date of Patent: Dec. 3, 2019

(54) UTILITY METER HAVING COMPRESSED DATA LOGGING

(71) Applicant: Landis+Gyr LLC, Lafayette, IN (US)

(72) Inventor: Daniel Mondot, Lafayette, IN (US)

(73) Assignee: Landis+Gyr LLC, Lafayette, IN (US)

( * ) Notice: Subject to any disclaimer, the term of this patent is extended or adjusted under 35 U.S.C. 154(b) by 680 days.

(21) Appl. No.: 14/252,502

(22) Filed: Apr. 14, 2014

(65) Prior Publication Data

US 2014/0309956 A1 Oct. 16, 2014

Related U.S. Application Data

(60) Provisional application No. 61/811,604, filed on Apr. 12, 2013.

(51) Int. Cl.
*G01R 22/10* (2006.01)
*G01D 4/00* (2006.01)
*G01D 9/00* (2006.01)

(52) U.S. Cl.
CPC .......... *G01R 22/10* (2013.01); *G01D 4/002* (2013.01); *G01D 9/005* (2013.01); *Y02B 90/241* (2013.01); *Y04S 20/32* (2013.01)

(58) Field of Classification Search
None
See application file for complete search history.

(56) References Cited

U.S. PATENT DOCUMENTS

| | | | | |
|---|---|---|---|---|
| 4,332,980 A | * | 6/1982 | Reynolds | H04M 11/00 340/870.02 |
| 4,445,214 A | * | 4/1984 | Reynolds | H04M 11/00 370/389 |
| 4,700,188 A | * | 10/1987 | James | G01R 21/08 324/110 |
| 4,811,249 A | * | 3/1989 | Marsh | G01D 9/005 341/50 |

(Continued)

FOREIGN PATENT DOCUMENTS

EP 2381579 A1 10/2011
JP H06-289927 A 10/1994

(Continued)

OTHER PUBLICATIONS

International Search Report & Opinion for PCT/US2014/034035, dated Sep. 2, 2014.

(Continued)

*Primary Examiner* — Gregory J Toatley, Jr.
*Assistant Examiner* — Brandon J Becker
(74) *Attorney, Agent, or Firm* — Kilpatrick Townsend & Stockton LLP

(57) ABSTRACT

A method for storing information within a utility meter includes generating in a processing circuit first information regarding a metered quantity delivered to a load corresponding to a first period of time. The method also includes obtaining a first value associated with one of a plurality of predetermined ranges of values in which the first information falls. The method further includes generating in a (Continued)

processing circuit a second value representative of a numerical position of the first information within the one of the plurality of predetermined ranges of values. The first value and the second value are stored in a memory.

19 Claims, 9 Drawing Sheets

(56) References Cited

U.S. PATENT DOCUMENTS

| | | | | |
|---|---|---|---|---|
| 5,168,170 | A | * | 12/1992 | Hartig ............... H02J 3/14 |
| | | | | 307/34 |
| 5,933,004 | A | * | 8/1999 | Jackson ............ G01R 22/065 |
| | | | | 324/110 |
| 5,999,808 | A | * | 12/1999 | LaDue ............... A63F 13/12 |
| | | | | 455/412.2 |
| 6,121,158 | A | | 9/2000 | Benchikha |
| 6,374,188 | B1 | | 4/2002 | Hubbard |
| 6,564,159 | B1 | | 5/2003 | Lavoie |
| 6,946,972 | B2 | | 9/2005 | Mueller et al. |
| 7,769,344 | B1 | * | 8/2010 | Harvey ............. G06Q 30/0251 |
| | | | | 345/629 |
| 2004/0202374 | A1 | * | 10/2004 | Venkataraman ....... H04N 19/13 |
| | | | | 382/239 |
| 2005/0240540 | A1 | | 10/2005 | Borleske et al. |
| 2008/0042871 | A1 | * | 2/2008 | Donaghey ............ G06F 8/654 |
| | | | | 340/870.01 |
| 2008/0301517 | A1 | * | 12/2008 | Zhong ............. H03M 13/1102 |
| | | | | 714/752 |
| 2010/0122143 | A1 | * | 5/2010 | Lee ............... H03M 13/1117 |
| | | | | 714/752 |
| 2010/0315263 | A1 | | 12/2010 | Shuey | | |
| 2011/0071773 | A1 | * | 3/2011 | Saylor ............... G01D 9/005 |
| | | | | 702/45 |
| 2011/0193569 | A1 | * | 8/2011 | ALRawi ............... H03B 5/36 |
| | | | | 324/652 |
| 2011/0288793 | A1 | | 11/2011 | Sanchez-Loureda et al. |
| 2011/0301894 | A1 | | 12/2011 | Sanderford |
| 2012/0010831 | A1 | * | 1/2012 | Kagan ............... G01D 4/004 |
| | | | | 702/60 |
| 2013/0018843 | A1 | | 1/2013 | Bultman et al. |
| 2013/0293219 | A1 | | 11/2013 | Ramirez et al. |

FOREIGN PATENT DOCUMENTS

| | | | |
|---|---|---|---|
| JP | 2006038630 A | * | 2/2006 |
| JP | 2008-58006 A | | 3/2008 |
| JP | 2011-244441 A | | 12/2011 |
| MX | 353163 | | 12/2017 |

OTHER PUBLICATIONS

U.S. Appl. No. 14/880,170, Final Office Action dated May 30, 2018, 16 pages.
U.S. Appl. No. 14/880,170, Non-Final Office Action dated Oct. 16, 2018, 13 pages.
U.S. Appl. No. 14/880,170, Non-Final Office Action dated Sep. 20, 2017, 16 pages.
International Application No. PCT/US2014/034035, International Preliminary Report on Patentability dated Oct. 22, 2015, 6 pages.
Japanese Office Action in corresponding application JP 2016-507900, dated Apr. 10, 2018.
U.S. Appl. No. 14/880,170, "Notice of Allowance", dated Jul. 11, 2019, 8 pages.

* cited by examiner

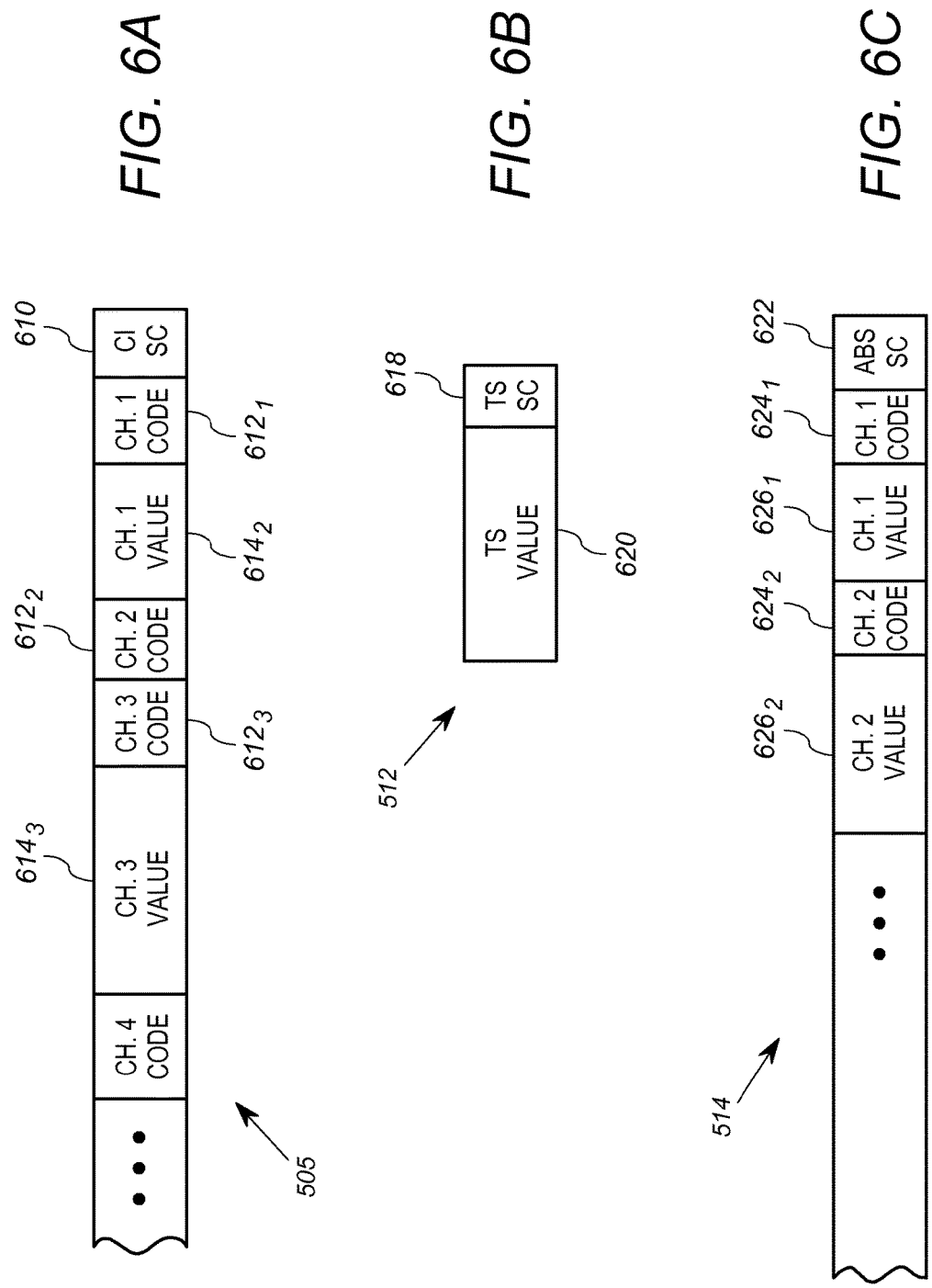

UTILITY METER HAVING COMPRESSED DATA LOGGING

This application claims the benefit of U.S. Provisional Patent Application No. 61/811,604, filed Apr. 12, 2013.

FIELD OF THE INVENTION

The present invention relates generally to utility meters, and more particularly, to data logging in utility meters.

BACKGROUND

Utility meters are used to monitor the consumption of a utility-delivered commodity, such as, gas, water and/or electricity. The consumption information generated by a utility meter is typically used for billing purposes. For example, in its simplest form, a utility meter detects consumption and records a value representative of a total consumption over time. The consumer of the commodity is billed in proportion to the customer's usage of the commodity as measured by the meter.

Accordingly, one of the goals of electricity metering is to accurately measure the use or consumption of electrical energy resources. With such measurements, the cost of generating and delivering electricity may be allocated among consumers in relatively logical manner. Another goal of electricity metering is help identify electrical energy generation and delivery needs. For example, cumulative electricity consumption measurements for a service area can help determine the appropriate sizing of transformers and other equipment. Such goals apply similarly to gas and water metering.

In order to study energy usage patterns, and in some circumstances, adjust billing practices appropriately, it is sometimes advantageous to log commodity consumption as a function of time. In electricity metering, this practice is known as load profiling. A load profiling meter stores a series of records identifying one or more metered quantities and a time of day in which the metered quantity was consumed. For example, a load-profiling electricity meter may record and store energy consumption (i.e. watt-hrs), average power, apparent energy consumption (VA-hrs) and amp-hours for each fifteen minute interval in time. The resulting load profile data is stored in a memory, preferably non-volatile memory, within the meter. The meter may communicate the load profile data log to a utility computer by either remote transmission, or through a local connection. Once the load profile data is transferred from the meter, the data may be erased or overwritten within the meter.

Although meters and load profiling systems are designed such that load profile data can be erased from the meter periodically, the storage of load profile data can still require significant amounts of memory. Presently, it is common for meters to generate metering values of up to 32 bits. Storing 32 bit values for multiple quantities every five to fifteen minutes, along with appropriate time and date stamps, can consume substantial memory over the course of time, for example, a month. In addition to the memory requirements, the transfer of such data can occupy significant bandwidth. Accordingly, there is a need to ease the memory requirement and transmission requirements to carry out load profiling.

SUMMARY OF THE INVENTION

A first aspect of the invention is a method of recording data for load profiling or other purposes within a meter that employs a data compression scheme. The data compression allows for greater amounts of data to be logged within the meter with less data storage than would otherwise be required.

A first embodiment is a method for storing information within a utility meter that includes generating in a processing circuit first information regarding a metered quantity delivered to a load corresponding to a first period of time. The method also includes obtaining a first value associated with one of a plurality of predetermined ranges of values in which the first information falls. The method further includes generating in a processing circuit a second value representative of a numerical position of the first information within the one of the plurality of predetermined ranges of values. The first value and the second value are stored in a memory.

The above described features and advantages, as well as others, will become more readily apparent to those of ordinary skill in the art by reference to the following detailed description and accompanying drawings.

BRIEF DESCRIPTION OF THE DRAWINGS

FIGS. 6A-6C show schematic diagrams of different data structures used in the using the data compression operation of FIG. 4;

DETAILED DESCRIPTION

Figure 1:
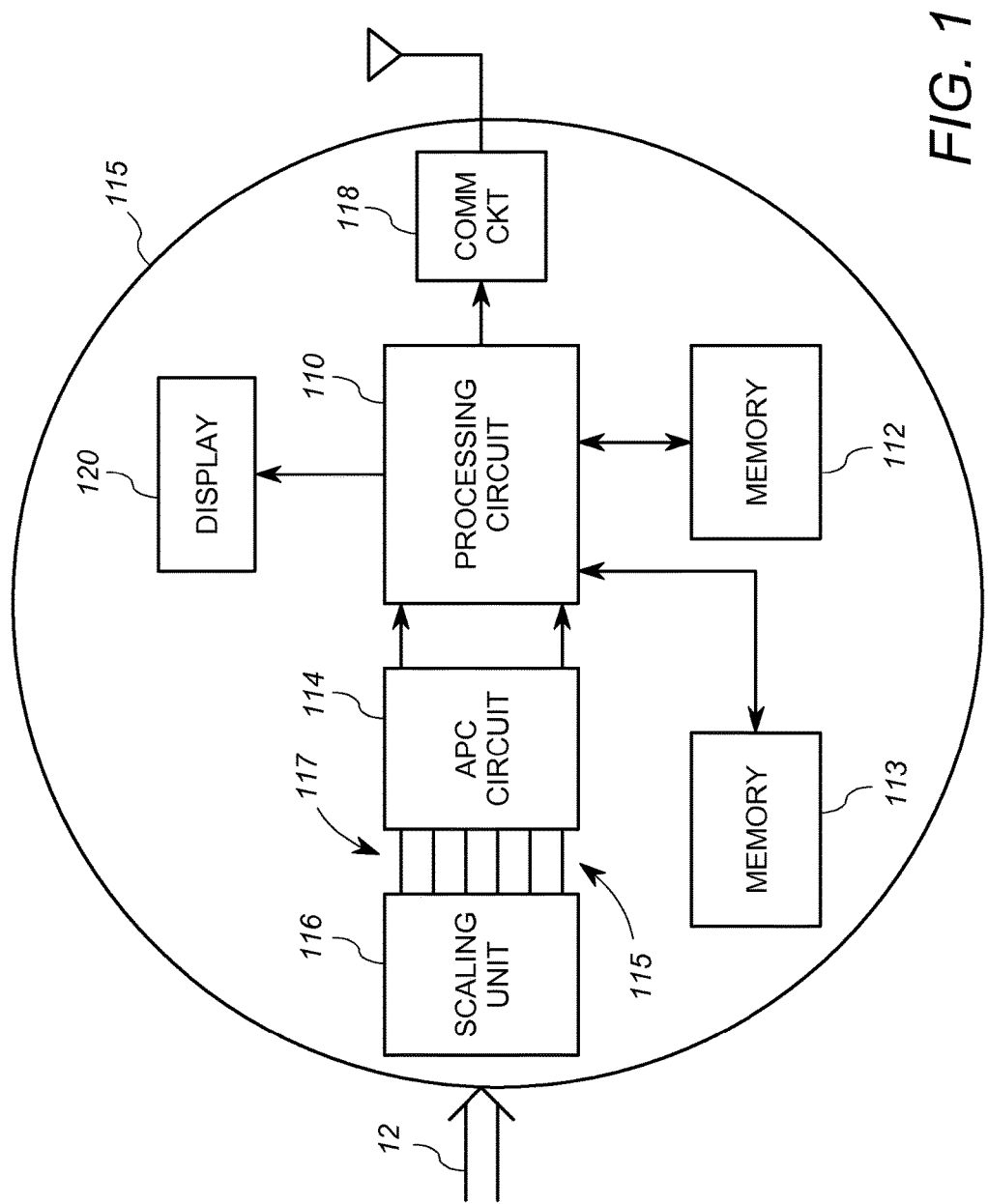
FIG. 1 shows an exemplary meter that may be used in one or more embodiments of the present invention.

FIG. 1 shows an exemplary embodiment of a poly-phase electricity meter 10 in which an arrangement according the invention is implemented. Referring to FIG. 1 specifically, the electricity meter 10 is an apparatus for measuring energy consumption that includes a scaling circuit 110, a first memory 112, a second memory 113, an analog to digital conversion ("ADC") circuit 114, a processing circuit 116, a communication circuit 118, and an optional display 120. All of the above listed elements are preferably supported by a meter housing 115, which may take a plurality of known forms. The communication circuit 118 may be disposed within an interior of the meter housing 115 like the other devices, or may be affixed to the outside of the meter housing 115.

In general, the meter 10 is configured to store load profile data in a compressed way at least one of the memories 112, 113. As mentioned above, a load profile is a series of periodic snap-shots of measured information (such as voltage, current or energy), which may be used to capture a customer's consumption profile through time, for diagnostic or billing purposes. A load profile may include periodic measurements of a single quantity, such as energy (watt-hrs), or periodic measurement of multiple quantities, each forming a "channel" of the load profile data.

For example, a load profile could record watt hour consumption in a first channel, and VAR-hrs in another channel. The exemplary load profile could store values in both channels for every 5 minute interval over several weeks. An "interval" is the amount of time that corresponds to each piece of data stored, in this case, a five (5) minute time period.

In the embodiment described herein, the load profile data is compressed before being stored in memory 112, preferably an EEPROM inside the meter 10. Unlike generic compression methods, the compression method for load profile data must be adapted for use with a never-ending stream of data, and furthermore does not rely on a dictionary of commonly found patterns (such as used in LZW compression method). Such a dictionary of patterns would quickly become obsolete or would refer to ancient data that would be overwritten.

Instead, the compression method described herein is partly based on the idea that, throughout the course of a day, the load is somewhat stable. Because the load is relatively stable, the data from one interval is not, in general, significantly different from the data of the previous interval. Thus, part of this compression scheme relies on the use of differential values, or in other words, storing for each interval the difference of the actual value measured from the same measured value in the prior interval.

To achieve a compression ratio of about 60% of less, this algorithm:

a) Divides the memory 112 in blocks of data that are "self-contained", meaning that no data from another block is needed to decode that block. This is needed in order to be able to read only part of the data stream without having to decode the stream from the very end of it;

b) Stores the actual value of the data "as is" only for the first or last interval of every block. For every other interval, only the delta (difference between that interval and the next one) is stored. That allows for a smaller number to be stored, per interval, per channel; and c) Compresses smaller numbers using fewer bits than those used for bigger numbers. Since the values being recorded are relatively stable (and hence the differential values are small), more small numbers are recorded than bigger numbers.

Referring again specifically to FIG. 1, the scaling circuit 110 and the ADC circuit 114 are arranged to generate digital signals representative of line voltage waveforms VA, VB, VC for each of three phases A, B, C of a poly-phase electrical system and other digital signals representative of line current waveforms IA, IB, and IC of the poly-phase electrical system. It will be appreciated that the meter 10 need not be one that is configured and use in a poly-phase system. In other embodiments, the meter 10 may be readily be configured for a single phase residential system, or any other common electrical service.

In any event, the digital signals are typically sequences of digital samples representative of an instantaneous voltage or current measurement on one phase with respect to either neutral or another phase. Circuits capable of generating such signals are known in the art.

The processing circuit 116 is configured to calculate one or more energy consumption values based on the digital signals. The energy consumption values may be communicated to a remote device using the communication circuit 118, displayed using the display 120, stored in the data store 112, or preferably some combination of the foregoing. At least some energy consumption values are stored in the first memory 112 using one or more of the compression techniques disclosed herein.

In further detail, the scaling circuit 110 may suitably comprise current and voltage sensors, not shown. The voltage sensors, which may, for example, include voltage dividers, generate a scaled down version of the voltage present on phases of the power lines 12. The current sensors, which may suitably include current transformers, shunts, embedded coil devices and the like, generate a voltage or current signal that is a scaled down version of the current present on the phases of the power lines 12. Various voltage and current sensors are conventional. However, the embodiments of the invention may readily be employed with non-conventional sensors as well.

The ADC circuit 114 includes one or more analog-to-digital converters that convert the scaled measurement signals into digital voltage and current measurement signals. Many circuits capable of generating digital voltage and circuit waveform signals are well known in the art. Suitable examples of analog to digital conversion circuits having such capabilities are described in U.S. Pat. Nos. 6,374,188; 6,564,159; 6,121,158 and 5,933,004, all of which are incorporated herein by reference. Moreover, the ADC circuit 114 may readily be a part of an integrated metering chip package, as will be discussed below.

The processing circuit 116 is a device that employs one or more processing devices such as microprocessors, microcontrollers, digital signal processors, discrete digital circuits and/or combinations thereof. As mentioned above, the processing circuit 116 is operable to generate energy consumption data based on the digital signals. In one example, the processing circuit 116 generates watt-hour information based on an accumulation of products of contemporaneous voltage and current samples. For example, true watt-hours for a particular phase may be calculated as the vector product of the current waveform and the voltage waveform. This vector product may be carried out with sampled voltage ($V_n$) and sampled current ($I_n$) by the formula:

$$Whrs = \Sigma V_n * I_n. \qquad (3)$$

where Whrs is an accumulated energy value (i.e. watt-hours) for a time frame from a starting time $n_0$ to a time corresponding to n.

In addition, the processing circuit 116 may generate VA, VA-hrs, watt-hours, VAR-hrs, power factor, root-mean-square voltage and/or current, or combinations of any of the foregoing. Various processing circuits operable to generate energy consumption data from digital voltage and digital current measurement signals are well known in the art. Suitable examples of such circuits are described in U.S. Pat. Nos. 6,374,188; 6,564,159; 6,121,158 and 5,933,004. However, in one preferred embodiment, the processing circuit is (or includes) a processing element of a metering integrated circuit chip such as the Maxim 71M6533 measurement chip.

In accordance with one embodiment, the processing circuit 116 is configured to generate first information regarding a metered quantity delivered to a load corresponding to a first period of time. The first information may be an actual measured quantity over the first period time (e.g. watt-hrs consumed over the first period of time, average power during the first period of time, etc.), or a difference between a measured quantity over the first period time and the measured quantity over a previous period of time (e.g. a differential value). The processing circuit is further configured to obtain a stored code associated with one of a plurality of predetermined ranges of values in which the first information falls. In particular, within the meter, each possible value of the metering quantity (e.g. a 32-bit value) is associated with one of a plurality or ranges of values. The processing circuit 116 is configured to determine which of the ranges of values the first information falls within, and determine the code associated with that range of values. The processing circuit 116 is also configured to generate a compressed value representative of a numerical position of the first information within one of the plurality of predetermined ranges of values. Finally, the processing circuit 116 is further configured to store the code and the compressed value in a memory, for example, the first memory 112.

In at least some embodiments, the second memory 113 includes memory located within the integrated package that houses the processing circuit 116. The second memory 113 may suitably be a random access memory, EEPROM, other memory, or a combination of several types of memory. The second memory 113 includes a software program that is executed by the processing circuit 116 to perform the operations of the processing circuit 116 described herein, including those of FIGS. 3, 4 and 7. The second memory 113 also suitably stores operational values used by the processing circuit 116 during normal operations.

The communication circuit 118 is a device that is in some embodiments configured to communicate data between the metering unit 10 and one or more remote devices. In a system such as that shown in FIG. 1, the communication circuit 118 would be operable to communicate directly or indirectly with a data collection system of a utility service provider. Several of such systems are known. In at least some embodiments, the utility service provider uses the collected data to generate billing information and/or data forecasting information as is known in the art. To this end, the communication circuit 118 may suitably include a radio, a telephone modem, a power line carrier modem, or other known communication device configured for use with utility meters. Radios may be used that operate in the 100 MHz to 1 GHz range. However, other devices may operate in the kHz or low MHZ range.

Figure 8:
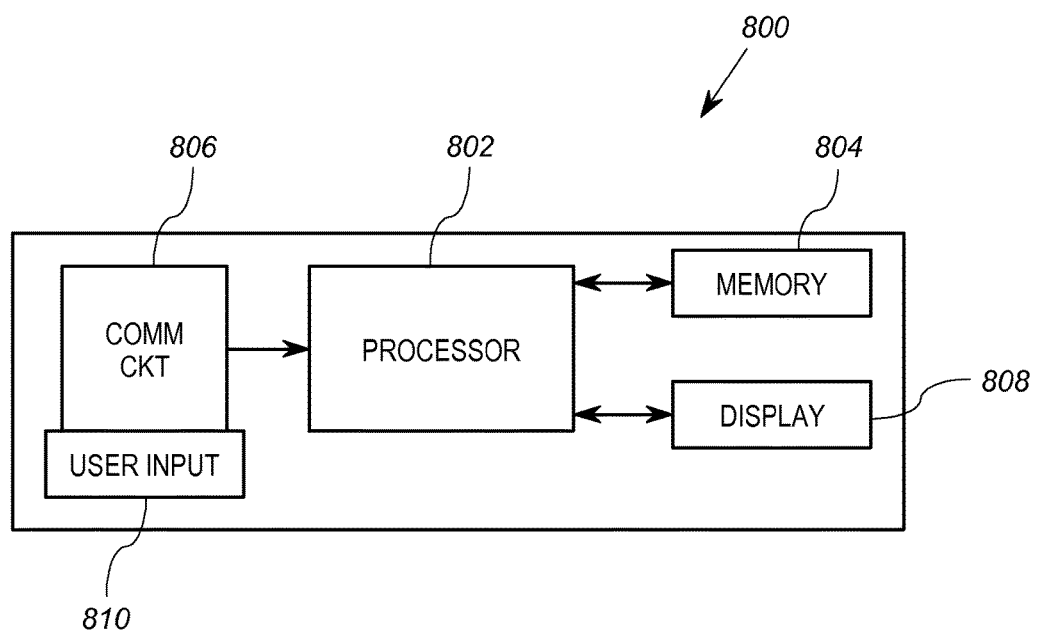
FIG. 8 shows a schematic block diagram of a computing device configured to read out and decompress data compressed using the data compression operation of FIG. 4.

In addition or in the alternative, the communication circuit 118 is configured to communicate with a locally coupled device, such as a portable computing device via an optical port. The communication circuit 118 may include an optical or electrical data port, not shown, for this purpose. FIG. 8, discussed further below, shows one exemplary portable computing device that is configured to communicate locally with the metering unit 10 via the communication circuit 118.

The meter display 120, which is optional, may be a digital display such as a liquid crystal display. It will be appreciated that the exact nature of the display is not particularly important to the implementation of the invention. Nevertheless, there is an advantage of including at least some display capabilities. LCD displays, moreover, have been found to have a particularly advantageous set of qualities for use in electronic meters.

In general, the scaling unit 110 of the meter 10 is operably connected to the electrical service lines to obtain voltage measurements and current measurements representative of the voltage and current delivered to the load. The scaling unit 110 is further operably coupled to provide voltage and current measurement signals to the ADC circuit 114.

The ADC circuit 114, in turn, samples each of the voltage and current measurement signals and generates corresponding digital sample streams. The sample rate is typically many times the cycle frequency of the AC waveform, such that the samples collectively provide an accurate sampled representation of the corresponding analog waveform. The operations of the scaling unit 110 and the ADC circuit 114 as discussed above are conventional.

The processing circuit 116 then calculates watt-hrs by multiplying contemporaneous voltage and current samples, and accumulating the resulting products. Using sampling, the processing circuit 116 may suitably perform the following calculations:

$$\text{Watt-hr}_a = \Sigma(V_a(s) * I_a(s)) \quad (1)$$

$$\text{Watt-hr}_b = \Sigma(V_b(s) * I_b(s)) \quad (2)$$

$$\text{Watt-hr}_c = \Sigma(V_c(s) * I_c(s)) \quad (3)$$

$$\text{Watt-hr} = \text{Watt-hr}_a + \text{Watt-hr}_b + \text{Watt-hr}_c \quad (4)$$

wherein $V_x(s)$ is the sampled voltage at a time s on phase x at the meter 10, and $I_x(s)$ is the sampled current at a time s on phase x at the meter 10. In the above equations, the term Watt-hr is actually an energy measurement in terms of watt-hrs.

The processing circuit 116 may suitably calculate vector (or load) VARs using equations that use 90 phase degree shifted voltage measurements, as is known.

$$\text{VAR}_a = \Sigma(V_a(s+90°) * I_a(s)) \quad (5)$$

$$\text{VAR}_b = \Sigma(V_b(s+90°) * I_b(s)) \quad (6)$$

$$\text{VAR}_c = \Sigma(V_c(s+90°) * I_c(s)) \quad (7)$$

$$\text{VAR} = \text{VAR}_a + \text{VAR}_b + \text{VAR}_c \quad (8)$$

It will be appreciated that the various other value may be calculated using the samples signals Va(s), Vb(s), Vc(s), Ia(s), Ib(s), and Ic(s), include per-phase or aggregate average power, amp-hrs, VA, VA-hrs, and the like.

The processing circuit 116 performs such calculations in an ongoing manner to thereby detect, track and record various aspects about the energy being delivered to the load. Thus, the scaling circuit 110, the ADC circuit 114 and at least a part of the processing circuit 116 collectively form a metrology circuit 117 that is operably coupled to power lines 12 to a load and configured to generate energy consumption values based on the voltage and current provided to the load. It will be appreciated that the metrology circuit 117 may take other forms that are conventional.

In addition, from time to time, for example, every five to fifteen minutes, the processing circuit 116 stores information relating to one or more metering values in the memory 112 as part of a data log or "load profile". Each stored value is associated with a defined time interval. It will be appreciated that the processing device(s) of the circuit 116 that perform load profiling may or may not be or include the same processing device of the processing circuit 116 that forms a part of the metrology circuit 117.

Figure 2:
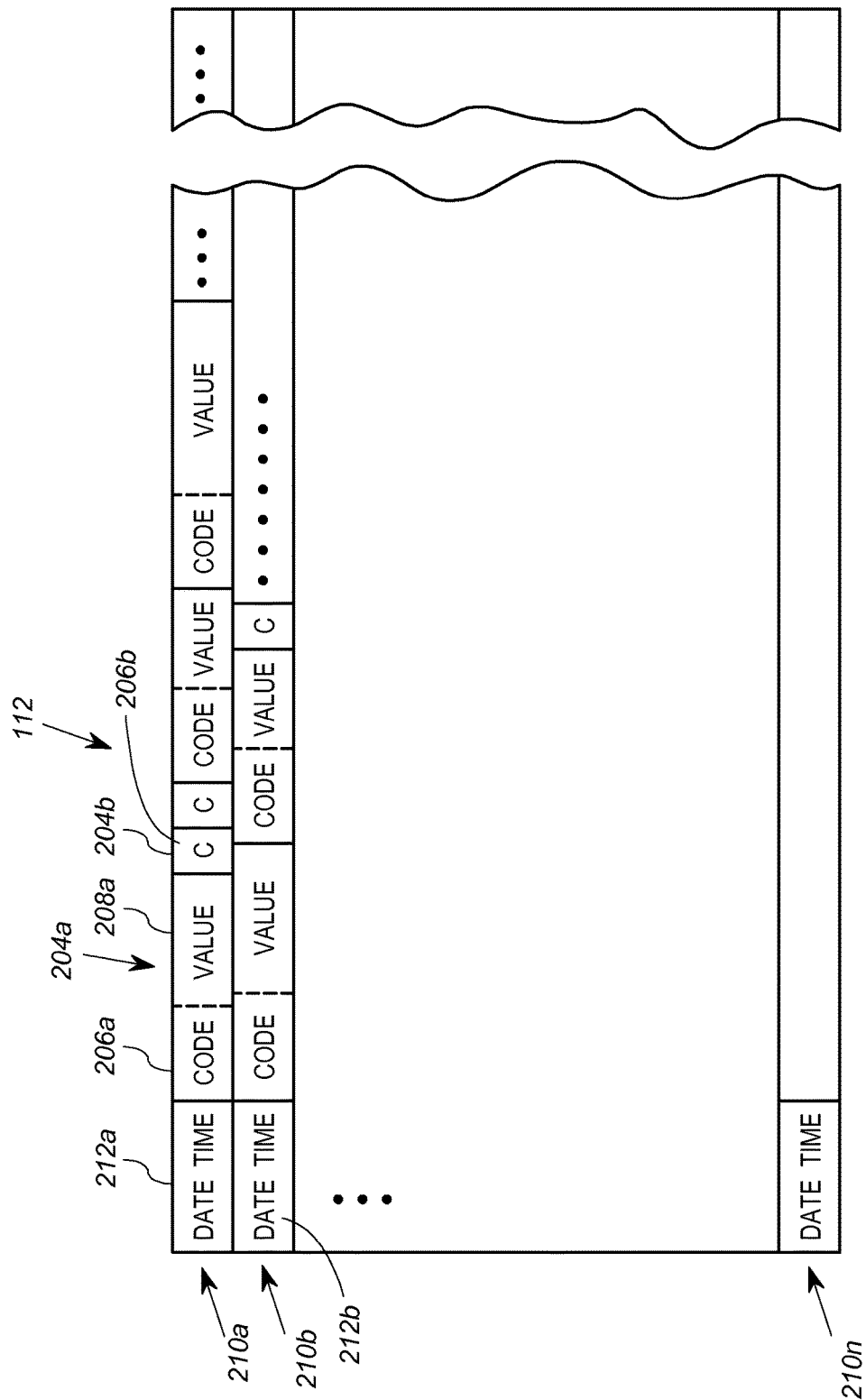
FIG. 2 shows a schematic block diagram of a memory of the meter of FIG. 1 storing data compressed in accordance with a first embodiment of the invention.

In accordance with embodiments of the present, the memory 112 is an EEPROM memory divided into physical blocks. Referring now to FIG. 2, the first memory 112 ranges of values, and the prefix (i.e. first value) 206x that corresponds to that range. The entire range of values of Table 1 covers every possible 32-bit value.

TABLE 1

| prefix (first value) 206 binary code | prefix length | suffix (second value) 208 binary code | value 204 encodes for negative values | suffix (second value) 208 binary code | value 204 encodes for positive values | suffix length | Total length |
|---|---|---|---|---|---|---|---|
| 0 | 1 | — | — | — | 0 | 0 | 1 |
| 10000 | 5 | 1000-1111 | −8 to −1 | 0000-0111 | +1 to +8 | 4 | 9 |
| 10001 | 5 | 1000-1111 | −16 to −9 | 0000-0111 | +9 to +16 | 4 | 9 |
| 10010 | 5 | 10000-11111 | −32 to −17 | 00000-01111 | +17 to +32 | 5 | 10 |
| 100110 | 6 | 100000-111111 | −64 to −33 | 000000-011111 | +33 to +64 | 6 | 12 |
| 100111 | 6 | 1000000-1111111 | −128 to −65 | 0000000-0111111 | +65 to +128 | 7 | 13 |
| 101000 | 6 | 10000000-11111111 | −256 to −129 | 00000000-01111111 | +129 to +256 | 8 | 14 |
| 101001 | 6 | etc . . . | −512 to −257 | etc . . . | +257 to +512 | 9 | 15 |
| 101010 | 6 | etc . . . | −1024 to −513 | etc . . . | +513 to +1024 | 10 | 16 |
| 101011 | 6 | etc . . . | −2048 to −1025 | etc . . . | +1025 to +2048 | 11 | 17 |
| 101100 | 6 | etc . . . | −4096 to −2049 | etc . . . | +2049 to +4096 | 12 | 18 |
| 101101 | 6 | etc . . . | −8192 to −4097 | etc . . . | +4097 to +8192 | 13 | 19 |
| 101110 | 6 | etc . . . | −16384 to −8193 | etc . . . | +8193 to +16384 | 14 | 20 |
| 101111 | 6 | etc . . . | −32768 to −16385 | etc . . . | +16385 to +32768 | 15 | 21 |
| 110000 | 6 | etc . . . | −65536 to −32769 | etc . . . | +32769 to +65536 | 16 | 22 |
| 110001 | 6 | etc . . . | −131072 to −65537 | etc . . . | +65537 to +131072 | 17 | 23 |
| 110010 | 6 | etc . . . | −262144 to −131073 | etc . . . | +131073 to +262144 | 18 | 24 |
| 110011 | 6 | etc . . . | −524288 to −262145 | etc . . . | +262145 to +524288 | 19 | 25 |
| 110100 | 6 | etc . . . | −1048576 to −524289 | etc . . . | +524289 to +1048576 | 20 | 26 |
| 110101 | 6 | etc . . . | −2097152 to −1048577 | etc . . . | +1048577 to +2097152 | 21 | 27 |
| 110110 | 6 | etc . . . | −4194304 to −2097153 | etc . . . | +2097153 to +4194304 | 22 | 28 |
| 110111 | 6 | etc . . . | −8388608 to −4194305 | etc . . . | +4194305 to +8388608 | 23 | 29 |
| 111000 | 6 | etc . . . | −16777216 to −8388609 | etc . . . | +8388609 to +16777216 | 24 | 30 |
| 111001 | 6 | etc . . . | −33554432 to −16777217 | etc . . . | +16777217 to +33554432 | 25 | 31 |
| 111010 | 6 | etc . . . | −67108864 to −33554433 | etc . . . | +33554433 to +67108864 | 26 | 32 |
| 111011 | 6 | etc . . . | −134217728 to −67108865 | etc . . . | +67108865 to +134217728 | 27 | 33 |
| 111100 | 6 | etc . . . | −268435456 to −134217729 | etc . . . | +134217729 to +268435456 | 28 | 34 |
| 111101 | 6 | etc . . . | −536870912 to −268435457 | etc . . . | +268435457 to +536870912 | 29 | 35 |
| 111110 | 6 | etc . . . | −1073741824 to −536870913 | etc . . . | +536870913 to +1073741824 | 30 | 36 |
| 111111 | 6 | etc . . . | −2147483648 to −1073741825 | etc . . . | +1073741825 to +2147483647 | 31 | 37 | includes a plurality of blocks 210a, 210b, . . . 210n. FIG. 2 illustrates the memory 112 populated by data compressed in accordance with a first embodiment of the invention. The first embodiment is a simplified version of a load profile for a single meter value that is compressed and stored in the memory 112. FIGS. 4-8, discussed further below, show another embodiment that uses the same compression scheme to store multiple values in a load profile log.

Referring now to the embodiment of FIG. 2, the first memory 112 stores a data log of a "load profile", wherein information corresponding to metering data for a defined block of time is stored in a way that the time in which the metering data was generated can be identified. The data is stored sequentially such that the timing of the data can be reconstructed by obtaining an anchor time for one interval's data, and then adding or subtracting the interval time for each successive data record, depending on the reading direction.

In FIG. 2, the memory 112 stores the data log as a plurality of compressed values 204a, 204b, etc. At least some compressed values, such as the compressed value 204a, includes at least a prefix 206a and a suffix 208a. Other compressed values, such as the compressed value 204b, include only a single prefix 206b. In this embodiment, the prefix 206a is a first value or code that corresponds to and identifies one of a plurality of predetermined ranges of values. The suffix 208a is a second value that represents a number within the one of the plurality of predetermined ranges of values. By way of non-limiting example, Table 1 shows a plurality of It can be seen from the above table that each range of uncompressed values includes in this embodiment a negative side and a positive side, to allow negative numbers to be logged as well. In general, each prefix 206x defines which range (i.e. which row in the table) is applicable, and the suffix 208x represents a numerical or sequential position of the corresponding uncompressed value within the range. So for example, consider a value 204a compressed as 10100000001111. This value splits into a prefix 206a of 101000, and a suffix 208a of 00001111. From the above table, the prefix 206a of 101000 identifies that the value is in the range of −256 to −129 and 129 to 256. The first bit of the value "00001111", which is 0, indicates that the value is in the positive half-range: 129 to 256. The binary value 0001111 corresponds to 15, which indicates that the value is the fifteenth in sequence in the range of 129 to 256. Because 129+15=144, the decompressed value is 144. In other words, the compressed value of 10100000001111 equates to 144. It will be appreciated that although the decompressed value could be any 32-bit value, this particular value has been compressed to 14 bits.

It will be appreciated that information representative of the Table 1, or at least the portion thereof related to the prefixes and the corresponding ranges of values, may be stored in a memory that is different than the memory 112, for example, the memory 113 or some other memory. In this way, the compressed load profile data may be stored separately from operating data of the meter 10.

Referring again to FIG. 2, it will be appreciated that the second compressed value 204b includes only a single prefix value with no suffix. As shown in Table 1, the single code value 0 represents a single-bit range of uncompressed values, namely, 0. Thus, a value of "0" in a 32-bit system can be compressed to a single bit, such as the second compressed value 204b of FIG. 2. It will be appreciated that the compression scheme shown in Table 1 enables such compression because only one prefix 206x starts with a binary value of 0. Simple digital logic or processing operations can immediately determine that any compressed value is a single value, and not part of some longer prefix 206x. Similarly, if any code starts with a 1, and the next four digits represent a value of 0 to 2 (binary) included, then the code is a five-bit code. Any other code starting with a one is a six-bit code.

Referring again specifically to FIG. 2, in the embodiment described the memory 112 each block 210x of memory 112 includes an initial value 212x that is a date-time stamp. The time-date stamp 212x at the beginning of each block 210x allows for quick indexing/access to load profile metering data for a particular day and time.

In operation, the processing circuit 116 performs normal metering operations to obtain various metering values, such as watt-hours (real energy), VA-hrs (apparent energy), and VAR-hrs (reactive energy), current, voltage, as well as other values. At specific intervals, for example, the processing circuit 116 compresses and stores information relating to those meter values in the memory 112. In this embodiment, the processing circuit 116 stores a compressed version of an actual metering value, such as watt-hrs consumed in the last interval, or overall, as the first value 204a for the first interval after the time stamp 212a. For subsequent time intervals (until the block 210a is full), the processing circuit 116 compresses and stores the difference in the metering value from the last time interval. Thus, each block 210x starts with a time stamp value 212x, a first value 204a that is a compressed version of an absolute metering value, and a plurality subsequent values 204b, 204c, etc. that are compressed versions of a differential metering value.

Figure 3:
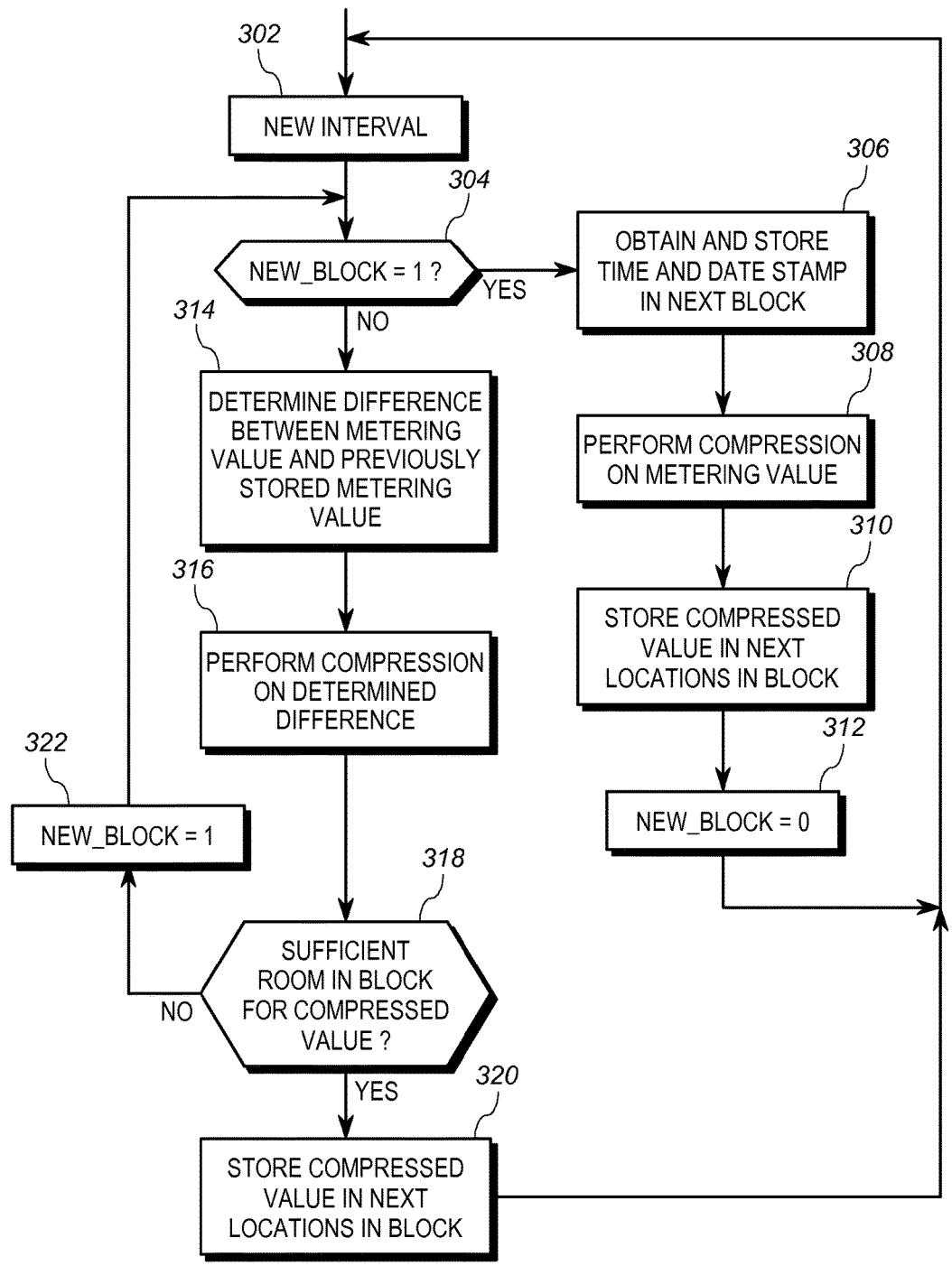
FIG. 3 shows a flow diagram of an exemplary set of operations of the processing circuit of the meter of FIG. 1 in carrying out a data compression operation.

FIG. 3 shows a flow diagram of an exemplary set of operations of the processing circuit 116 to carry out the operation as discussed above. The operations of FIG. 3 occur at every load profile time interval, such as every 1 to 60 minutes (step 302). The processing circuit 116 first determines if a NEW_BLOCK flag, representing that a new memory block will be stored to (step 304). If NEW_BLOCK is set, then the processing circuit 116 proceeds to step 306. If not, then the processing circuit 116 proceeds to step 314.

In step 306, the processing circuit 116 obtains a time and date stamp and stores it in the first bit locations of a new block 210x of the memory 112. The processing circuit 116 then (step 308) performs a compression step on the metering value that is being "profiled" or logged. As discussed above, this value may be the watt-hrs consumed over the last time interval, VAR-hrs consumed over the last time interval, total watt-hrs, or other values. As will be discussed below, the data log may be divided into multiple channels so that several values may be logged, each value occupying a different, but consistent channel.

In any event, after step 308, the processing circuit 116 stores the compressed value (step 310) in the next memory locations in the memory 112. Thereafter, the processing circuit 116 resets NEW_BLOCK (step 312) and then returns to step 302 to await the next time interval.

Referring back to step 304, if it was determined that NEW_BLOCK is not set, then the processing circuit 116 determines the difference between the current metering value to be logged, and the previously logged metering value (step 314). Thus, in step 314, the processing circuit 116 determines a differential value for the metering value being logged or profiled. In step 316, the processing circuit 116 performs the compression operation on the determined differential value. The processing circuit 116 thereafter proceeds to step 318.

In step 318, the processing circuit 116 determines whether the current block 210x of the memory 112 has sufficient space for the compressed value generated in step 316. If so, then the processing circuit 116 stores the compressed value in the next memory locations of the current block 210x (step 320) and returns to step 302 to await the next time interval. If not, however, then the processing circuit 116 sets NEW_BLOCK=1 (step 322) and proceeds directly to step 304.

It will be appreciated that the above-operations may readily be adapted for multiple channels of data logging, as will be discussed below in connection with FIGS. 4-8. In such a case, multiple values (e.g. watt-hrs, VAR-hrs, etc.) are each compressed and stored as per FIG. 3 every interval.

It will further be appreciated that the compression steps 308, 316 both operate in the same manner on their respect values to be compressed. In step 308, the value to be compressed, CV, is the metering value. In step 316, the value CV is the determined differential value. In either case, the processing circuit 116 uses a look-up table or the like to determine the appropriate prefix 206 (e.g. from FIG. 2) based on the range in which the value CV falls. The processing circuit 116 then determines the suffix 208 based on the numerical position (or some other one-to-one correlation) of CV with the range.

Thus, several features of this embodiment are particularly useful in load profiling in electricity meters. In particular, the use of differential values for a large portion of the stored interval data combined with the significant compression of smaller values can result in substantial overall reduction in memory usage as compared to storing full 32-bit values for each new interval. It will be appreciated that the inventive compression scheme described herein may readily be adapted to other value sizes, such as 16-bit or 64-bit values, as well as others.

There are quasi unlimited ways to implement this principle. But the basic ideas are to: Extract the differences between slowly changing numbers; Encode them in bit patterns of smaller size for smaller values and bigger size for larger values (e.g. Table 1); and Place markers at regular intervals so that the bit stream hence created doesn't need to rely on the existence of data that is too old (e.g. the time and data stamps 212a, 212b, etc.). Thus, old data can be discarded and the bit stream can still be read. It will further be appreciated that the compression scheme is lossless, meaning that the decompressed data does not experience any loss of information from the original data that was compressed.

FIGS. 4-8 illustrate a compression and load profiling method that may be carried out to store information to the memory 112 for multiple metering values, and further includes other additional features for preserving the use of memory and for ease of reading out. For example, the embodiment of FIGS. 4-8 stores compressed load profiling data such that the memory 112 may be read out and decompressed in a direction opposite of the way it is written. In general, the actual compression used in the embodiment of FIGS. 4-8 are identical to those described above in connection with FIG. 2 and Table 1.

Figure 4:
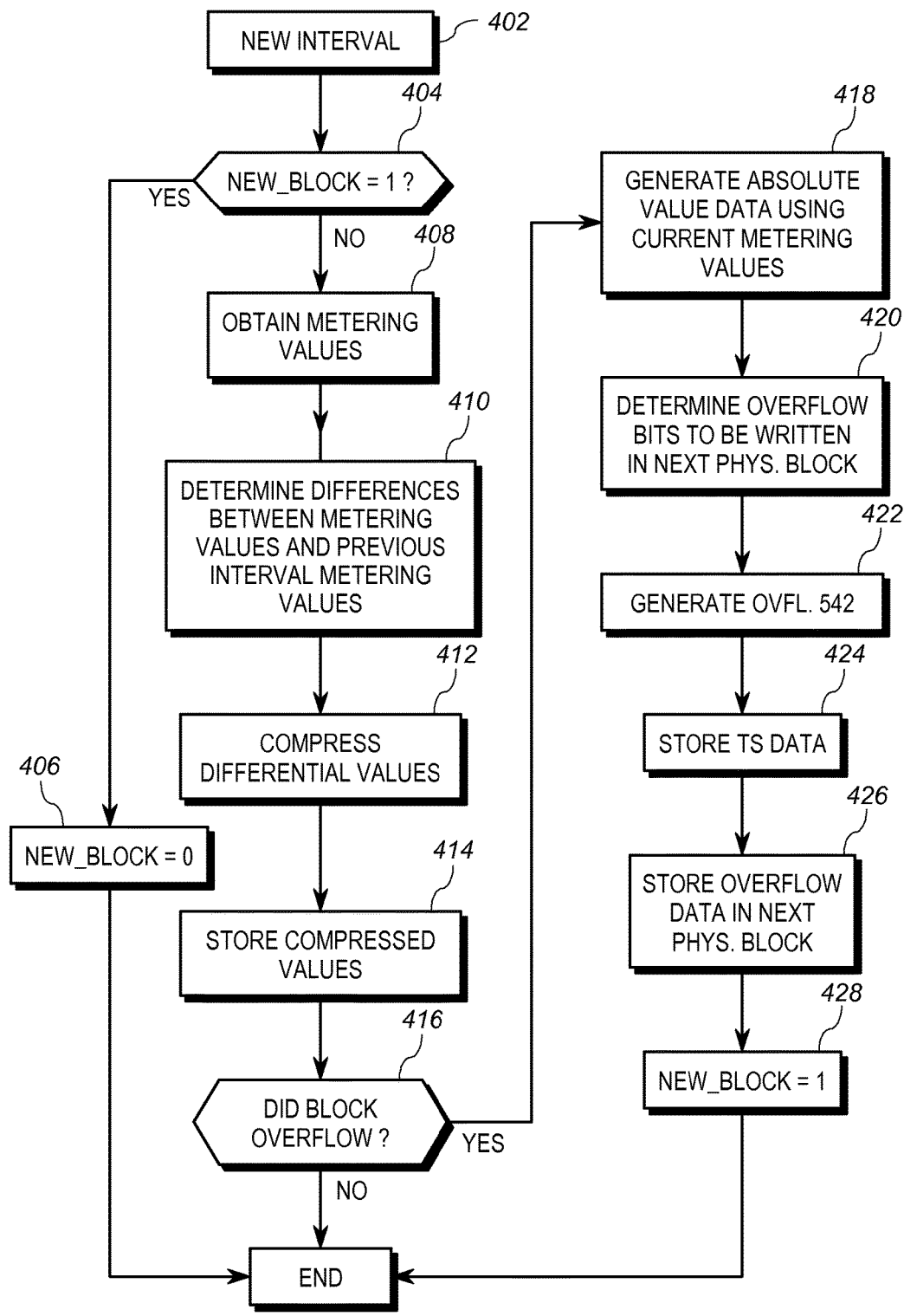
FIG. 4 shows a flow diagram of an exemplary set of operations of the processing circuit of the meter of FIG. 1 in carrying out a data compression operation in accordance with a second embodiment of the invention.

FIG. 4 shows a flow diagram 400 of a set of operations that, like that of FIG. 3, is carried out every load profile (or other timing) interval, such as every 1 to 60 minutes. In other words, the flow diagram 400 shows an alternative to the operations of FIG. 3. FIG. 4 will be discussed below in reference to FIGS. 5A and 5B.

Figure 5A:
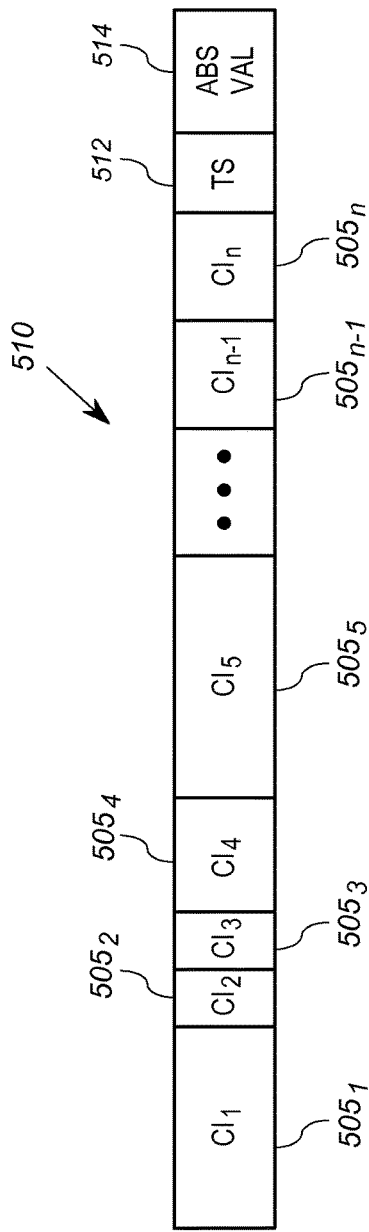
FIG. 5A shows a schematic diagram of a portion of the memory of the meter of FIG. 1 storing data compressed using the data compression operation of FIG. 4.

FIG. 5A shows an alternative embodiment of a logical memory block 510 that may be stored in the memory 112. The term logical memory block 510 refers to a collection of compressed values (and other values), stored in the memory 112, that are approximately sufficient to fill a physical memory block of an EEPROM. However, because compressed interval values (e.g. values 204a, 204b of FIG. 2) have variable lengths, it is rare that a particular compressed value or set of compressed values will exactly fill a physical memory block. As a consequence, in the embodiment described here below, a logical memory block 510 may be split into two physical memory blocks, with the second physical block acting as an overflow for the first. To this end, FIG. 5B shows a fragmentary view of the ends of two adjacent memory physical memory blocks 550, 552 of the memory 112, which contain, among other things, the logical memory block 510.

Figure 5B:
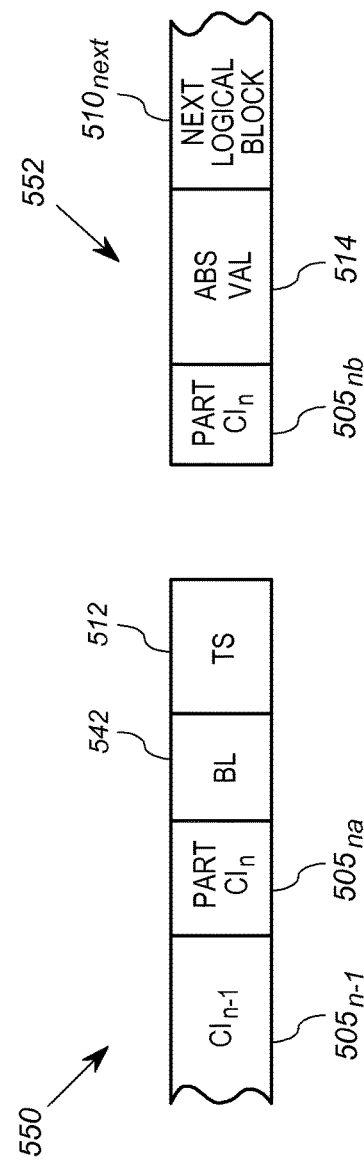
FIG. 5B shows a fragmentary schematic diagram of two physical data blocks of the memory of the meter of FIG. 1 storing data compressed using the data compression operation of FIG. 4.

Referring to FIGS. 5A and 5B, the logical memory block 510 and the physical memory blocks 550, 552 have a plurality of bit-locations wherein bits of data may be stored and read sequentially. In accordance with the embodiment described herein, each logical memory block 510 stores date-and-time stamp (TS) data 512 and absolute value data 514. The TS data 512 and the absolute value data 514 are preferably disposed at or near an end of the block. In the remainder of the bit-locations are compressed intervals $505_x$. A compressed interval $505_x$, discussed further below, is all of the metering data for a specified time interval x, which has been compressed using the manner describe above in connection with steps 314, 316 of FIG. 3, or similar method.

Referring to FIG. 5B, the physical memory block 550 stores the TS value 512 of the logical memory block 510 at an end location thereof. It will be appreciated that the physical memory block 550 stores nearly all of the logical memory block 510. However, the absolute value data 514 and/or the last compressed interval $505_n$ may be stored partially or fully in the next physical memory block 552 as an overflow. In the example discussed herein, the last compressed interval $505_n$ is stored partially in each of the physical memory blocks 550, 552, and the absolute value data 514 is stored completely in the next memory block 552. To this end, a part $505_{na}$ of the compressed interval $505_n$ is stored in the physical memory block 550 and another part $505_{nb}$ of the compressed interval $505_n$ is stored in the physical memory block 552. The absolute value data 514 represents the end of the logical block 510. In the physical memory block 552, the subsequent bit locations are used to store the next logical block $510_{next}$.

In the embodiment of FIG. 5B, the physical memory block 550 ends with an overflow length block 542 and the time stamp data 512, each of which has predetermined bit-size. The overflow length block 542 identifies how many bits of the logical block 510 that are stored in the next physical data block 552. In other words, the value in the overflow length block represents the number of bits of the part $505_{nb}$ and the absolute value data 514. It will be appreciated that the physical memory block 552 and other physical memory blocks will have the same general structure as the physical memory block 550. Each one terminates in an overflow length block 542 and time stamp value 512 in identical corresponding positions. However, the number of bits and sizes of partial compressed intervals (e.g. $505_{na}$ and $505_{nb}$) and absolute value data (e.g. 514) will vary for each individual physical data block.

FIG. 6A shows in further detail a single compressed interval 505 which illustrates the general format of the compressed intervals $505_x$ of FIGS. 5A and 5B. The compressed interval 505 includes an interval start code 610, which indicates that the following data is compressed interval data 505. In this embodiment, the interval start code is "1", a single bit. As will be discussed below, all other start codes (e.g. for TS data 512 and absolute value data 514) begin with "0" and have additional bits. The interval start code 610 is chosen as the only single bit code because the compressed interval 505 typically occurs the most often.

The compressed interval 505 then includes a sequential series of prefixes $612_y$ and suffixes $614_y$ for each of a plurality of channels, where y is the channel index. As discussed above, each "channel" corresponding to a specific metering value that is logged in every time interval. Each channel is compressed separately. To this end, each channel prefix $612_y$ is generated in the same way as the prefix 206 of FIG. 2, and each channel suffix $614_y$ is generated in the same way as the suffix 208 of FIG. 2. Thus, for example, the prefix $612_1$ indicates the range of values in which the corresponding metering value falls, as per Table 1, while the suffix $614_1$ indicates where within the indicated range the corresponding meter value falls, as per Table 1. As with the embodiment of FIG. 1, the prefix $612_y$ (such as prefix $612_2$) can be single 0 bit indicative of a compressed value of "0", or (such as prefixes $612_1$ or $612_3$) can be a five or six bit number that identifies the size and applicable range of the suffix $614_y$ as per Table 1. It will be appreciated, however, that the same compression scheme can be carried out with different values and/or different groupings of values, and not just those shown in Table 1.

Referring again to FIGS. 5A, 5B, the absolute value data 514 is a set of non-differential compressed values for an interval. FIG. 6C shows a fragmentary view of an absolute value data block 514. Referring to FIG. 6C, for each channel y of the load profile data, the absolute value data 514 includes a prefix $624_y$ and suffix $626_y$, similar to the prefixes $612_x$ and suffixes $614_x$ of the compressed interval $505_x$. However, in the absolute value data 514, the compressed data is not representative of the difference between the current interval and the prior interval, but rather is a compressed version of the actual metering data for the current interval. Thus, the absolute value data 514 is generated using the same compression method discussed above, but applied to actual metering values such as kWh, peak demand, $I_{RMS}$, etc. The absolute value data 514 also includes a start code 622, which in this embodiment is a four digit code indicating an absolute value block. The absolute value data 514 in every logical data block and physical data block helps protect against a large loss of data if part of the data becomes corrupted. In particular, if all of the data were differential (from period to period), then the corruption of any data can cause the loss of large amounts of data because the differential reference values are corrupted. The periodic insertion of absolute value blocks 514 allows for ease of data recovery in the event of data corruption.

Referring again to FIGS. 5A, 5B, the time stamp (TS) data 512 comprise a set of values representative of real time and date, or at least the real time of day. FIG. 6B shows a TS data block 512. Referring to FIG. 6B, the TS data block 512 includes a TS data start code 618 and a time stamp value 620. As discussed above, the time stamp value 620 is representative of at least the time of day, and preferably the time and date. The time stamp value 620 may suitably be compressed using any conventional lossless technique. Because time stamps do have the same features as the load profile data, the compression technique for the time stamp data 620 need not be the one used to encode the channel data. The start code 618 in this embodiment is a four digit code indicating a time stamp block.

Referring again to FIG. 5A, the logical memory block 510 is arranged in the manner described herein to allow for ease of reading out of values. To this end, the block 510 is generally written from left-to-right in FIG. 5A, and read out from right-to-left. The physical memory blocks 550 and 552 are written and read in the same way.

Referring now to FIG. 4, the operations start off at the conclusion of a load profile time interval (step 402). At the end of a time interval, the "current interval", the processing circuit 116 determines whether the flag value NEW_BLOCK=1 in step 404. If so, then the current interval is not processed because it is the first of a new logical data block 510, and the processing circuit proceeds to step 406. In step 406, the value NEW_BLOCK is reset to 0 and the processing for the interval ends. If, however, it is determined in step 404 that NEW_BLOCK=0, then the processing circuit 116 proceeds to step 408 to start processing the current interval.

In step 408, the processing circuit 116 obtains the metering values for the current interval. In this embodiment, multiple metering values, including a set of status values, are logged for each time interval. It will be appreciated that any number of channels may be logged in the memory 112, one channel per value. In this example, the values of watt-hours and amp-hours for the current interval are tracked, as well a set of status bits for the meter 10. Each of these values is a 32-bit value in uncompressed format. Status codes can include flags indicating whether there has been a power outage in the interval, whether there has been a clock change or tampering event during the interval, etc.

The processing circuit 116 then, in step 410, determines the difference between the metering values for the current interval, and same metering values from the prior interval. Thus, in step 410, the processing circuit 116 determines a differential value for the metering values being logged or profiled. Thus, in the example described herein, the processing circuit 116 would determine the difference between watt-hours consumed in the prior interval and the current interval, the difference between amp-hours consumed in the prior interval and the current interval, and the difference in status codes (numerical) between the prior interval and the current interval. This is done for each channel being profiled or logged.

In step 412, the processing circuit 116 performs the compression operation on each determined differential values separately, using the method described above in connection with FIG. 3. Thus, for example, if three 32-bit values are being logged or profiled, then each 32-bit metering value is separately compressed into a code and compressed value using Table 1 (or another scheme). Thus, the result of step 410 is a compressed interval $505_x$ such as the one shown in FIG. 6a. It will be appreciated that for values that do not change in many one to sixty minute intervals, such as status values, the compressed data log will be only a single "0" bit. For metering and/or status values that do change, they will nevertheless be compressed using the operations discussed above in connection with Table 1, by identifying an appropriate code value (e.g. code value 206x, 612x) and a corresponding compressed value (208x, 614x).

It will be appreciated that steps 410 and 412 are performed on a channel-by-channel basis.

In step 414, the compressed values are stored in the current physical data block, e.g. the data block 550. If the data block 550 overflows (after reserving space for the time stamp data 512 and the overflow length block 542), then the compressed data is stored to an overflow buffer.

After all of the channel data for the interval is stored in step 414, the processing circuit 116, in step 416, determines whether the data overflowed the current physical data block. As discussed above, the current physical data block overflows if the compressed interval data determined in steps 410, 412 exceeds the available bit-locations in the physical data block, while reserving a predetermined number of bits for the time stamp data 512 and the overflow length value 542. For example, at the end of the compressed interval $505_{n-1}$ of FIGS. 5A and 5B, the processing circuit 116 would determine that no overflow occurred. By contrast, at the end of the compressed interval $505_n$, the processing circuit 116 would determine that an overflow has occurred.

If the processing circuit 116 determines in step 416 that no overflow has occurred, then the processing of the current interval is completed, and the process ends. If the processing circuit 116 determines instead that an overflow has occurred, then the processing circuit 116 proceeds to step 418 to process the end of the logical data block 510.

In step 418, the processing circuit 116 first generates an absolute data block 514 using the current interval metering values. Thus, after step 418, the processing circuit 116 has generated both the compressed interval ($CI_n$) based on the current metering values and the prior interval metering values, and a compressed absolute data block 514 based on the current metering values. Thereafter, in step 420, the processing circuit 116 determines how many bits of the compressed interval and the absolute data block will be stored in the next physical data block (e.g. physical data block 552). For example, in the example of FIG. 5B, the processing circuit 116 would determine the number of bits in the part $505_{nb}$ and the absolute value block 514. In step 422, the processing circuit 116 uses the determined number of bits to generate the overflow length data 542, and stores the same at a predetermined location near the end of the current physical data block 550. In step 424, the processing circuit 116 furthermore obtains, compresses and stores the time stamp data 512 in the final bits of the current physical data block 550.

Thereafter, in step 426, the processing circuit 116 writes overflow data (e.g. blocks $505_{nb}$ and 514) to the next physical data block 552. The overflow data is written in the first (or last) bit-locations in the physical data block 552. Subsequent compressed intervals 505, from the next logical data block $510_{NEXT}$ will be stored sequentially thereafter in the physical data block 552. In step 428, the processing circuit 116 sets NEW_BLOCK to 1 and then ends the processing of the current interval.

Figure 7:
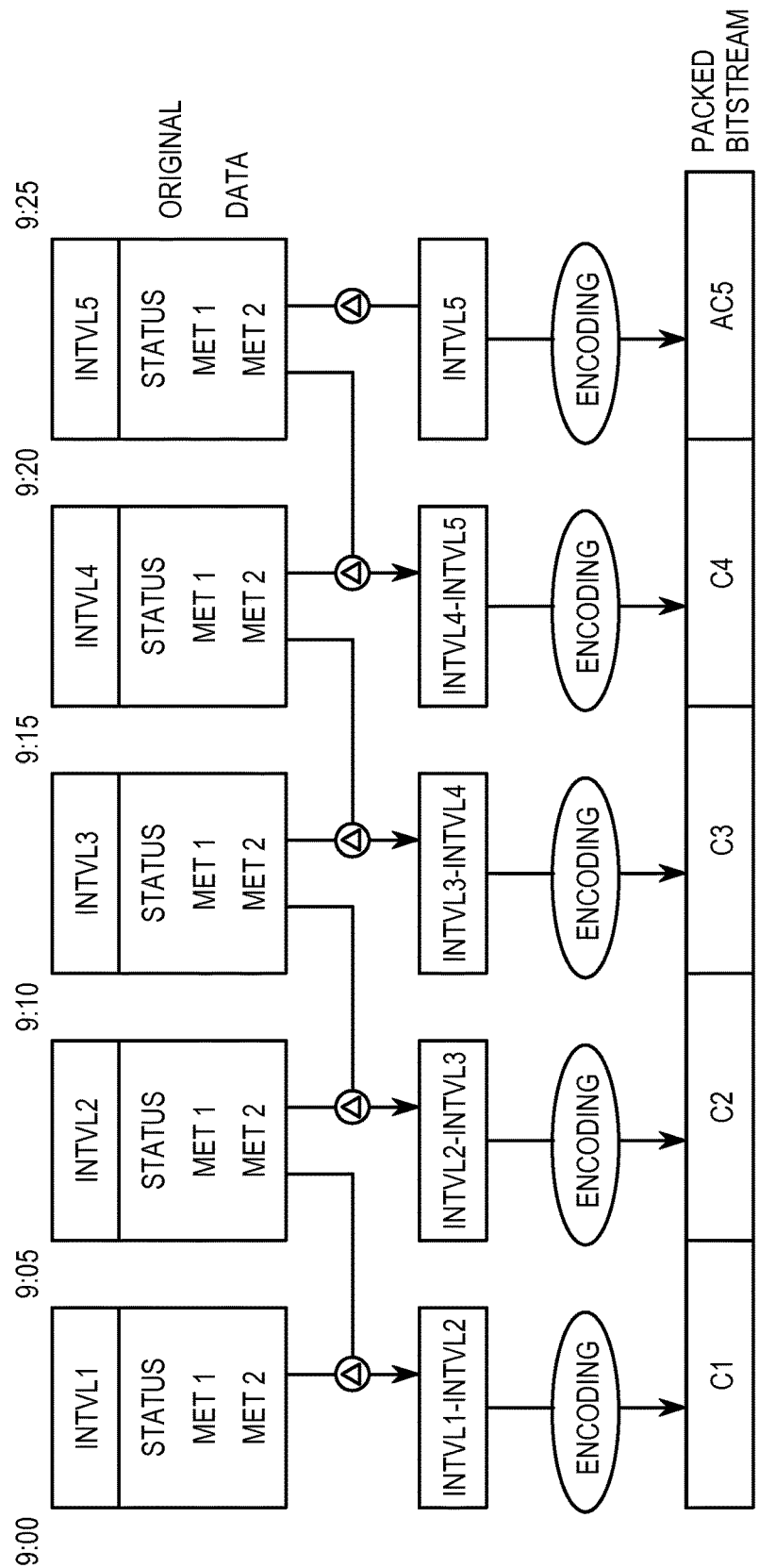
FIG. 7 shows a timing diagram of an exemplar compression operation carried out using the data compression operation of FIG. 4.

As discussed above, one advantage of the embodiment described herein is that the logical data block 510 (and hence physical data blocks 550, 552, etc.) are written in one direction, and read out in the opposite direction. FIG. 7 shows a block diagram of an example of the process of FIG. 4 for writing of multiple channels, including a channel dedicated to status information, of data to the logical memory block 510 of FIG. 5 over five intervals, each interval of five minutes length. In this embodiment three metering values (channels) are logged for each interval, including a Status value, a Metering 1 value, and a Metering 2 value. Each of the values Status, Metering 1, and Metering 2 is a 32-bit value and corresponds to a channel of the log. In particular, the Status value may suitably be a number of one-bit or multi-bit status indicators combined together as a single value. The Metering 1 value is a 32-bit value representative of energy consumed over an interval (e.g. watt-hrs), and the Metering 2 value is a 32-bit value representative of ampere-hours consumed over an interval.

In the example of FIG. 7, it will be assumed that the data from five intervals Intvl1, Intvl2, Intvl3, Intv4 and Intvl5 fit in a memory block (e.g. the memory block 510). It will further be assumed that a new block is started at the interval Intvl1. Thus, NEW_BLOCK=1. The example of FIG. 7 will be described in conjunction with the flow diagram of FIG. 4.

At 9:05, the interval Intvl1 is complete (step 402). The processing circuit 116 determines that NEW_BLOCK=1 in step 404, and performs no further actions, other than to reset the NEW_BLOCK=0 (step 406).

At 9:10, the interval Intvl2 is complete (step 402). The processing circuit 116 determines that NEW_BLOCK=0 in step 404, proceeds to step 408. The processing circuit 116 obtains the metering values Status(Intv2), Metering 1(Intv2), and Metering 2(Intv2) for the interval Intvl2 (step 408). Such values, of course, may be maintained in an ongoing basis by the processing circuit 116 to the extent that the processing circuit 116 forms a part of the metrology circuit 117 of the meter 10 of FIG. 1. The processing circuit 116 then determines the difference between each of the values Status(Intv2), Metering 1(Intv2), and Metering 2(Intv2) and the respective values from the previous interval and Status(Intv1), Metering 1(Intv1), and Metering 2(Intv1) (step 410). In other words, the processing circuit 116 performs the following operations:

Status($\delta$)=Status(Intvl1)–Status(Intvl2)

Metering 1($\delta$)=Metering 1(Intvl1)–Metering 1(Intv12)

Metering 2($\delta$)=Metering 2(Intvl1)–Metering 2(Intvl2).

The processing circuit 116 then performs compression operations on each of the differential values Status($\delta$), Metering 1($\delta$), and Metering 2($\delta$) to generate corresponding compressed values Status(CV), Metering 1(CV) and Metering 2(CV) (step 412). As per the compression algorithm discussed herein, each of the compressed values Status(CV), Metering 1(CV) and Metering 2(CV) may have a different bit-length, which is identified in the code portion (e.g. $612_y$, of FIG. 6A) of each compressed channel value.

The processing circuit 116 stores the compressed values Status(CV), Metering 1(CV) and Metering 2(CV) as a compressed interval $505_1$ in bit-position sequence in the memory block 510. (Step 414). Referring to FIG. 6A, the compressed value Status(CV) may suitably be stored as the prefix $612_1$ and suffix $614_1$, the compressed value Metering 1(CV), assuming it is "0" in this example, may suitably be stored as the prefix $612_2$, and compressed value Metering 2(CV) may suitably be stored as the prefix $612_3$ and suffix $614_3$, In FIG. 7, the composite compressed bit-stream portion C1, which is the combination of Status(CV), Metering 1(CV) and Metering 2(CV), is stored in the initial part of the memory block 510. The compressed bit-stream portion C1 corresponds to compressed interval $505_1$ of FIG. 5A.

After storing the compressed bit-stream portion C1, and assuming no overflow occurred (step 416), the processing circuit 116 awaits the next time interval, or until 9:15.

At 9:15, the interval Intvl3 is complete. (Step 402). The processing circuit 116 determines that NEW_BLOCK=0 in step 404, proceeds to step 408. The processing circuit 116 obtains the metering values Status(Intv3), Metering 1(Intv3), and Metering 2(Intv3) for the interval Intvl3 (step 408). The processing circuit 116 then determines the difference between each of the values Status(Intv3), Metering 1(Intvl3), Metering 2(Intvl3) and the respective values from the previous interval and Status(Intv2), Channel 1(Intv2), and Channel 2(Intv2) (step 410). In other words, the processing circuit 116 performs the following operations:

Status($\delta$)=Status(Intvl2)–Status(Intvl3)

Metering 1($\delta$)=Metering 1(Intvl2)–Metering 1(Intvl3)

Metering 2($\delta$)=Metering 2(Intvl2)–Metering 2(Intvl3).

The processing circuit 116 then performs compression operations on each of Status($\delta$), Metering 1($\delta$), and Metering 2($\delta$) to generate corresponding compressed values Status(CV), Metering 1(CV) and Metering 2(CV). (Step 412). The processing circuit 116 stores the compressed values Status(CV), Metering 1(CV) and Metering 2(CV) in sequence in the memory block 510. (Step 414). In FIG. 7, the composite compressed bit-stream portion C2, which is the combination of the current Status(CV), Metering 1(CV) and Metering 2(CV), is stored immediately following C1 in the memory block 510. The compressed interval C2 corresponds to the compressed interval $505_2$ of FIG. 5A.

After storing the compressed bit-stream portion C2, and assuming no overflow (step 416), the processing circuit 116 awaits the next time interval, or until 9:20.

The processing circuit 116 performs analogous operations at 9:20 (Intvl4) to store the next compressed differential values of Status, Metering 1, and Metering 2 as C3 in the memory location adjacent to that storing C2. The compressed interval C3 corresponds to the compressed interval $505_3$ of FIG. 5A.

At 9:25, the fifth interval Intvl5 is complete (step 402). The processing circuit 116 performs analogous operations at 9:20 to store the next compressed differential values of Status, Metering 1, and Metering 2 as C4 in the memory location adjacent to that storing C3. The compressed interval C4 corresponds to the compressed interval $505_4$ of FIG. 5A. However, it is assumed for this example that the processing circuit 116 has determined that the logical data block 510 is complete (presumably because the physical data block 550 has overflowed as determined in step 416). In such a case, the processing circuit 116 generates a compressed version of the absolute (not differential) metering values Status(Intv5), Metering 1 (Intv5), and Metering 2(Intv5) for the interval Intvl5 using the same general method described above in connection with Table 1. (Step 418). The processing circuit 116 then stores, for the current interval, the compressed absolute values Status(CAV), Metering 1(CAV), and Metering 2(CAV), as well as a time stamp, not shown in FIG. 7. (Steps 424, 426).

As a result, the processing circuit 116 then stores the absolute values Status(CAV), Metering 1(CAV), and Metering 2(CAV) in the block 510 after the value C4 as the value AC5. As discussed above, part of the interval values C4 and AC5 with the other part of C4 may be in adjacent physical memory blocks.

One of the advantages of the operations of FIGS. 4 and 7 is the ease with which the information may be read out. In general, load profile data has the most utility when it can be analyzed by the service provider. Accordingly, the data log in the memory 112 can be decompressed and transmitted by the meter itself, or can be accessed and decompressed by another device. Thus, the information stored in the data stream C1, C2, C3, C4 and AC5 of FIG. 7 is read out in reverse.

FIG. 8 shows an exemplary computing device 800 that may be used to obtain and decompress load profile data such as the data stored in the memory 112 in the method discussed above in connection with FIGS. 4 and 7. The computing device 800 may be a portable computing device used by a meter reading technician to download the data directly from the meter, or may be a remote computer that receives the data from a wired and/or wireless network transmission. To this end, the computing device 800 includes processor 802, a memory 804, a communication circuit 806, a display 808 and a user input device 810. The processing device 802 may suitably be any microprocessor of a general purpose, tablet, smartphone, or special purpose computer. The memory 804 preferably includes one or more volatile and non-volatile memory devices that are operably connected to the processing device 802. The memory 804 includes programming instructions for the processing device 802, and further provides space for the processing device 802 to store data such as uncompressed load profile data as discussed below. The display 808 and user input device 810 may suitably be any of those typically employed on readily available portable computers, desktop computers, tablet device, or smart phone device. The communication circuit 806 is a device configured to communicate with the communication circuit 118 of the meter 10 of FIG. 1. In one example, the communication circuit 806 includes infrared communication devices used to communicate directly with similar devices on the meter 10. In another example, the communication circuit 806 includes a modem that is configured to communicate digital signals over a network that can include the Internet, a wireless network, or a power line carrier (PLC) network.

In general, the communication circuit 806 receives data, such as the load profile data from the memory 112, and provides the data to the processing circuit 802. The processing circuit 802 receives and decompresses the data, which may then be stored for processing by the processing circuit 802 or another processing circuit, not shown. The processing circuit 802 in some cases may simply store the compressed data 802 in the memory 804 when first received, and then perform the decompression operations at a subsequent time.

Figure 9:
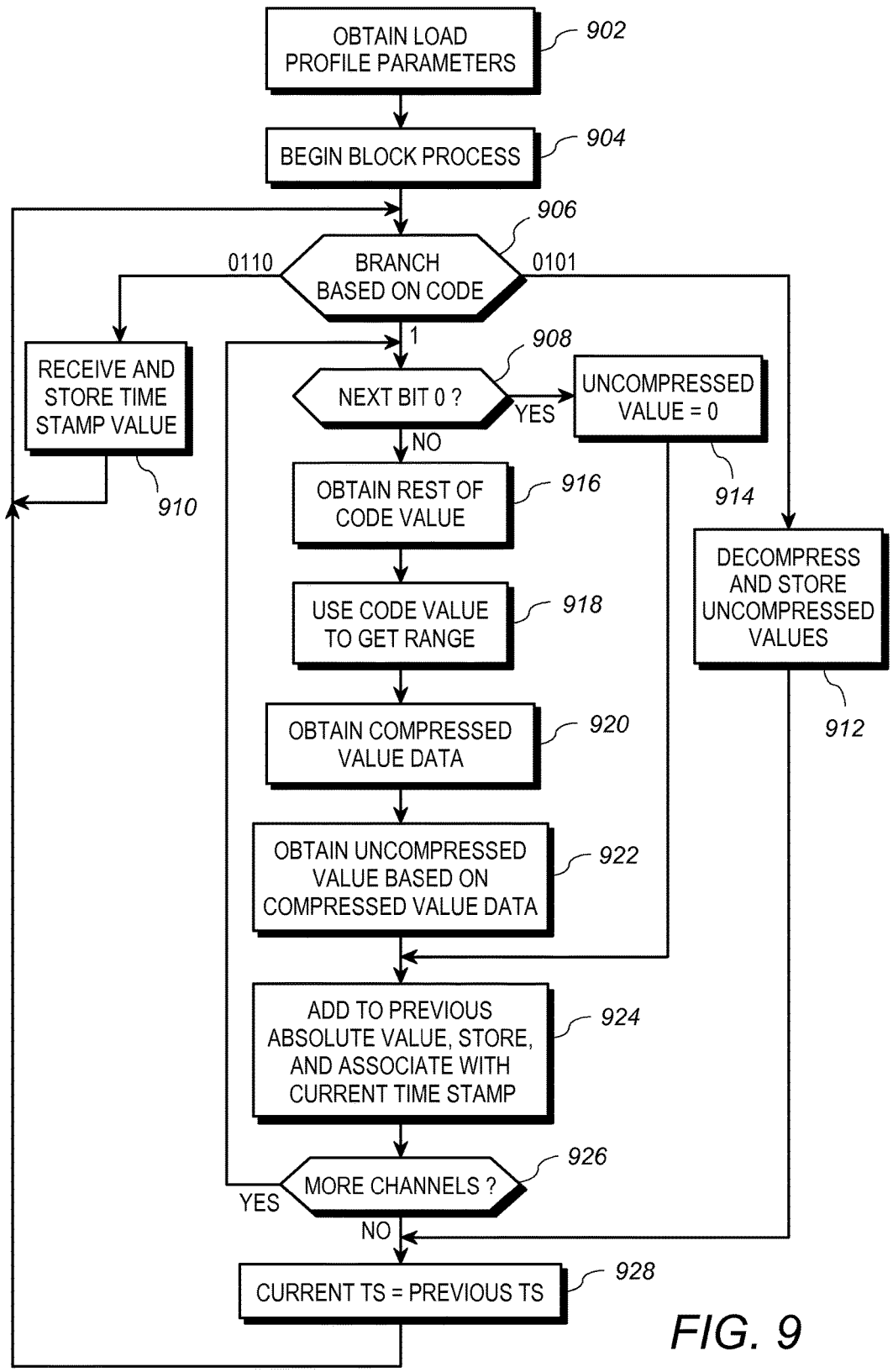
FIG. 9 shows a set of operations for carrying out decompression of data using the data compression operation of FIG. 4.

FIG. 9 shows a flow diagram of the operation of the decompression operation of the processing circuit 802.

In step 902, the processing circuit 802 obtains the load profile or data log parameters for the compressed data received by the communication circuit 806 from the meter 10. Such parameters can include the number of channels (i.e. values per time interval), the length of each interval. In some cases, the parameters can include an identification of the compression scheme and possibly even the Table 1 information. It will be appreciated that in some embodiments, the parameters may be entered manually, or preprogrammed into the memory.

Once the parameters of the compressed data log are known, the processing circuit 802 then begins by starting the decompression of the next block to be decompressed (step 904). As mentioned above, the decompression operation takes place by reading out data for each block in the opposite order in which it was stored. Thus, with reference to FIG. 5A, the data is read out for logical data block 510 starting with the absolute value data 514, and proceeding from right-to-left in the block 510. Thereafter, another block may be read out in the same way. In the embodiment described herein, however, the data is actually read from the physical data block 550 by reading the time stamp 512, and then the overflow length value 542. The rest of the logical data block 510 is read out by obtaining number of bits identified in block 542 from the next physical data block 552, and reading the absolute value data 514, the part $505_{nb}$ of the compressed interval $505_n$, proceeding to the physical data block 550, reading the part $505_{na}$ of the compressed interval $505_n$, and then otherwise proceeding as per FIG. 5A to read the rest of the compressed intervals $505_x$ of the logical data block 510 from the physical data block 550.

Accordingly, in step 906, the processing circuit 802 obtains the first bit of the data, which will include a code for the type of data that will be the following bits. The processing circuit 802 then performs different steps depending on the retrieved code. In this embodiment, if the first code bit is "1", then the ensuing data will be a compressed interval 505. (See element 610 of FIG. 6a). The processing circuit 802 would then proceed to step 908 to process a compressed interval. If, however, the first bit code bit is a "0", then the processing circuit 802 reads the next three bits as a continuation of the code. If the next three code bits are one sequence, e.g. 110, then the next block is a time stamp value 512, and the processing circuit 802 proceeds to step 910. If the next three code bits are yet another sequence, e.g. 101, then the next block is absolute value data 514 and the processing circuit 802 proceeds to step 912. Another four bit code, not shown, indicates that the next data is an overflow length value 542, which the processing circuit 116 would use to retrieve the overflow bits from the adjacent memory, from which point the processing circuit 116 can insert into the bit stream being read out from right to left.

It will be appreciated that other four-digit codes may be used to signal and end of the block or the insertion of other types of data.

In the case of step 910 (TS data), the processing circuit 802 obtains the next P bits and processes the time stamp data 512 to obtain the time stamp value. As discussed above the time stamp value is compressed into the time stamp data 512 using other techniques, or a special look-up table. The number P is predetermined because the length of time stamps is relatively consistent. In this embodiment, the processing circuit 802 stores the time stamp value and associates it with immediately previously received uncompressed values. If no uncompressed values were previously received, then the processing circuit 802 uses the time stamp value to identify a power interruption or other malfunction, and fixes the log accordingly. The processing circuit 802 then returns to step 906.

In the case of step 912 (absolute value data), the processing circuit 802 obtains and decompresses the absolute value data block 514. To this end, the processing circuit 802 employs the operations of steps 908 and steps 914-922, discussed further below. The processing circuit 802 stores the uncompressed meter values and proceeds to step 928, also discussed below.

In the case of step 908 (compressed interval), the processing circuit 802 retrieves the next bit, which is the first bit of the compressed interval 510. The first bit is the first (or only) bit of the code value $612_1$ for the first channel of data. If the first bit is a 0, then the processing circuit 802 proceeds to step 914. In step 914, the processing circuit 914 determines the uncompressed value to be 0. As discussed above, a code value of "0" indicates that the compressed value is also zero, and therefore a separate compressed value is not present. (See, e.g. Channel 2 code $612_2$ of FIG. 6). Thus, the processing circuit 802 needs to perform no further decompression and proceeds directly to step 924, discussed further below.

If, however, the processing circuit 802 determines in step 908 that the first bit is not a 0, then the processing circuit 802 proceeds to step 916. In step 916, the processing circuit 802 obtains the next Q bits to obtain the full non-zero code value $612_x$. As can be seen from Table 1 above, the number Q is determinative of length. If the first five bits are 10000, 10001 or 10010, then the number Q is five bits. If any other combination occurs, then the number Q is six bits. The processing circuit 802 then proceeds to step 918. In step 918, the processing circuit 802 uses a look-up table in the memory 804 to identify the range of values for the associated compressed value $614_x$ based on the code value $612_x$. For example, if the code value $612_x$ is 101001, then the processing circuit 802 determines that the associated value range is the −512 to −257 and 257 to 512 (including sign bit).

Thereafter, in step 920, the processing circuit 802 obtains the next R bits, which constitute the compressed value $614_x$. The number of bits R is predetermined for the range of values identified by the code value $612_x$. To this end, the look-up table in the memory 804 also associates a number of bits for each code value $612_x$. In step 922, the processing circuit 802 uses the compressed value $614_x$ to identify the corresponding number in the identified range from step 918. To this end, the first sign bit is identified, and then the remaining compressed value represents the numerical position of the value within the identified range. Thus, in the above example having a code value of 100110, the nine compressed value bits include a sign bit and eight value bits. In an example having a positive sign bit and remaining bits of 00000010, the processing circuit 802 would identify the corresponding uncompressed value of 257+(00000010) or 259. Once the decompressed value for the channel is identified, the processing circuit 802 proceeds to step 924.

In step 924, the processing circuit 802 first adds the uncompressed value to the stored, uncompressed absolute metering value from the prior interval. In other words, because the compressed values of a compressed interval $505_x$ are differential, the uncompressed values must be added to the previously processed value, which are absolute values, to obtain the full uncompressed value for the present interval.

The processing circuit 802 stores the uncompressed absolute metering value for the current channel and current interval, which in turn will be used to recreate the uncompressed absolute metering value for the next interval. In addition, the processing circuit 802 stores the uncompressed value in a way that associates the uncompressed value with a corresponding time stamp. The corresponding time stamp is determined based on the previously stored interval time minus the interval time period. Thus, if the current interval is the next interval after the time stamp obtained in step 910, then the associated time is B minutes earlier than the time stamp obtained in step 910, where B is determined by the log parameters obtained in step 902. Otherwise, the current time stamp is just the previous time stamp identified from the last processed compressed interval 505, minus B minutes. Thus, because the data is read out from the block 510 in reverse, they are read out in reverse chronological order and the time stamps decremented for each new interval that is decompressed.

In step 926, the processing circuit 802 determines if additional channels are to be processed for the current interval. The processing circuit 802 determines this from the log parameters received in step 902. If so, then the processing circuit returns to step 908. If not, then the processing circuit 802 proceeds to step 928.

In step 928, the processing circuit 802 has completed decompressing the compressed interval. The processing circuit 802 then sets the "previous time stamp" equal to the current time stamp, and returns to step 906 to process the next bit.

In this manner, the processing circuit 802 stores in its memory 804 an uncompressed load profile. This load profile may have a standardized format dictated by ANSI standards known in the art. The processing circuit 802 may then communicate the uncompressed data to another processor, not shown, for analysis. It will be appreciated that in some cases, the meter processing circuit 116 can be programmed to perform the steps of FIG. 9. However, instead of storing the uncompressed and formatted data the processing circuit 116 may decompress the data and stream the data out through the communication circuit 118 to another device.

It is known that the meter 10 can undergo a power failure from time-to-time, which can interrupt load profile log. In general, when the meter 10 undergoes a power failure, the processing circuit 116 stores the time of the power failure. When power is restored, the processing circuit 116 performs certain load profiling steps based on information on the power failure. The information includes, typically, the notification of the power failure, the time when the meter shut down, and the time power was restored to the meter. The processing circuit 116 generates such information in its other meter supervisory operations.

If the power failure did not span an entire profiling interval, then the processing circuit 116 simply sets a flag in a status word of the current interval $505_z$ that will be written net at the end of the current interval. If the power failure spanned over two adjacent profiling intervals, then the processing circuit 116 sets a flag in the status word of the current interval and completes processing the interval that was interrupted (e.g. $505_x$, then sets a flag in the status word that will be used when that next interval ends (e.g. $505_{x+1}$). If, however, the power failure spanned several intervals, then same as before, a flag in the status word of the current interval, that interval is completed, a time stamp 512 is inserted adjacent thereto in the data block 510, then a flag is set in the status word that will be used when that next interval ends (e.g. $505_{x+n}$). Thus, in the case of power outage, it is possible to have more than one time stamp in a single physical data block.

It will be appreciated that the above-described embodiments are merely illustrative, and that those of ordinary skill in the art may readily devise their own modifications and implementations that incorporate the principles of the present invention and fall within the spirit and scope thereof.

What is claimed is:

1. A computer-implemented method for compressing utility consumption measurements within a utility meter, comprising:
    sampling, at a first time, a first set of measurement signals from a voltage and current sensor;
    sampling, at a second time, a second set of measurement signals from the voltage and current sensor;
    generating, based on the first set of measurement signals and the second set of measurements signals, a differential representation of a change in a voltage and a current delivered by the utility meter to a load between the first time and the second time;
    compressing the first set of measurement signals and the second set of measurement signals by:
        accessing a table comprising a plurality of predetermined ranges of values, each range of values comprising one or more of (i) a corresponding prefix value and (ii) a corresponding suffix value;

responsive to determining that the differential representation is within one of the plurality of predetermined ranges of values, obtaining, from the table, a prefix value that represents the one of the predetermined range of values and adding the prefix value to a compressed value, the prefix value comprising one, five or six bits; and responsive to determining, that the prefix value comprises either five or six bits, obtaining from the table, a suffix value representative of a numerical position of the differential representation the one of the plurality of predetermined ranges of values, adding the suffix value to the compressed value;

storing the compressed value in a memory; and responsive to determining that a threshold amount of time has lapsed, retrieving the compressed value from the memory and transmitting the compressed value to an external device over a network.

2. The method of claim 1, wherein the second set of measurement signals represents a current metering value and the first set of measurement signals represents a prior metering value.

3. The method of claim 2, wherein the plurality of predetermined ranges of values includes ranges of values having different range sizes.

4. The method of claim 3, wherein the suffix value has a bit size corresponding to a range size of the one of the plurality of predetermined ranges of values.

5. The method of claim 1, wherein obtaining the corresponding prefix value comprises accessing a second memory that is different from the memory.

6. The method of claim 1, wherein storing the compressed value in memory comprises storing the prefix value and the suffix value in adjacent memory locations within the memory.

7. The method of claim 6, further comprising:

sampling, at a third time, a third set of measurement signals from the voltage and current sensor;

generating a second differential representation of a second change in voltage and a second change in current delivered by the utility meter during the second time and the third time;

compressing the second set of measurement signals and the first set of measurement signals by:

obtaining an additional prefix value;

determining, based on the additional prefix value, an additional suffix value;

adding the additional prefix value and the additional suffix value to an additional compressed value; and storing the additional compressed value adjacent to the compressed value in the memory.

8. The method of claim 6, further comprising, storing a combination of a plurality of combinations of other prefix values and other suffix values and the prefix value and the suffix value a first block in the memory, wherein the memory comprises a plurality of blocks.

9. The method claim 8, further comprising a storing a first time stamp value representing the first time in the first block in the memory, and storing a second time stamp representing the second time in a second block of the memory.

10. The method of claim 9, further comprising storing a second plurality of other prefix values and other suffix values in the second block of the memory.

11. A metering circuit, comprising:

a metrology circuit operably coupled to a load, the metrology circuit configured to generate energy consumption values based on a voltage and current provided to the load;

a memory; and a processing circuit configured to:

sample, at a first time, a first set of measurement signals;

sample, at a second time, a second set of measurement signals;

generate, based on the first set of measurement signals and the second set of measurement signals, a differential representation indicative of a change in energy consumption between the first time and the second time generate status information regarding a status condition of a meter between the first time and the second time;

responsive to determining that the differential representation is within one of a plurality of predetermined ranges of values, obtaining, a prefix value that represents the one of the predetermined ranges of values and adding the prefix value to a compressed value;

responsive to determining that the prefix value is greater than a threshold length, obtaining a suffix value representative of a numerical position of the differential representation within the one of the plurality of predetermined ranges of values, adding the suffix value to the compressed value, and storing the compressed value in the memory; and responsive to determining that a threshold amount of time has lapsed, retrieving the compressed value from the a memory and transmitting the compressed value to an external device over a network.

12. The metering circuit of claim 11, wherein the processing circuit is further configured to store the prefix value and the suffix value in adjacent memory locations within the memory.

13. A metering circuit, comprising:

a metrology circuit operably coupled to a load, the metrology circuit configured to generate energy consumption values based on a voltage and current provided to the load over a time period;

a memory storing compressed load profile data comprising an absolute value and a compressed value associated with a corresponding time period and comprising a prefix value identifying a range of values in which a differential value falls and a suffix value identifying a location of a differential value within the identified range of values; and a processing circuit operably coupled to the memory, the processing circuit configured to:

read, from the memory, the absolute value, the suffix value, and the prefix value;

generate, from the suffix value and the prefix value, the differential value;

generate, from the differential value and the absolute value, power information indicative of an amount of power delivered to the load during the time period; and transmit the power information to an external device.

14. The metering circuit of claim 13, wherein the memory comprises a plurality of compressed values, wherein each of the compressed values occupies a variable amount of space in the memory, each compressed value occupying one of a plurality of predetermined bit sizes that corresponds to a respective prefix value.

15. The metering circuit of claim 13, wherein the compressed load profile data further comprises a plurality of code values representative of first information in corresponding time periods, wherein the power information is a value of zero.

16. The metering circuit of claim 11, wherein the differential representation represents a numerical difference between energy consumption values between the first time and the second time.

17. The computer-implemented method of claim 1, wherein the prefix value is selected from a group comprising values of one, five, and six bit values.

18. The computer-implemented method of claim 1, further comprising:
   sampling, at a third time a third set of measurement signals from the voltage and the current sensor; and
   responsive to determining that insufficient space exists in the memory for an additional differential representation, storing the third set of measurement signals in the memory.

19. The computer-implemented method of claim 1, further comprising responsive to determining that a second amount of time has lapsed, sampling, at a third time a third set of measurement signals from the voltage and the current sensor and storing the third set of measurement signals in the memory.

* * * * *